United States Patent [19]

Loshing et al.

[11] 4,300,125
[45] Nov. 10, 1981

[54] SYSTEM FOR MONITORING, TRANSMITTING AND CONDITIONING OF INFORMATION GATHERED AT SELECTED LOCATIONS

[76] Inventors: Clement T. Loshing, 17836 Lake Rd., Lakewood, Ohio 44107; Ralph J. Thompson, 2399 W. Sprague Rd., Broadview Heights, Ohio 44147

[21] Appl. No.: 44,686

[22] Filed: Jun. 1, 1979

[51] Int. Cl.³ .................. G01R 21/00; H03D 3/06
[52] U.S. Cl. .................. 340/310 A; 340/870.26; 324/142; 329/122; 331/25
[58] Field of Search ........ 340/310 A, 177 R, 177 VC, 340/182, 183, 185, 207; 324/117 H, 118, 142, 790; 329/122, 123; 331/1 A, 21, 25, 116, 36 C

[56] References Cited

U.S. PATENT DOCUMENTS

| | | | |
|---|---|---|---|
| 3,135,537 | 6/1964 | Thompson et al. | 346/1 |
| 3,229,300 | 1/1966 | Thompson et al. | 346/1 |
| 3,234,543 | 2/1966 | Thompson et al. | 340/345 |
| 3,297,956 | 1/1967 | Thompson et al. | 331/177 |
| 3,559,057 | 1/1971 | Huggett | 324/79 D |
| 3,938,129 | 2/1976 | Smither | 340/170 |
| 4,002,995 | 1/1977 | Reed | 331/25 |
| 4,028,623 | 6/1977 | Dowdle, Jr. | 324/142 |
| 4,037,165 | 7/1977 | Ogita | 331/25 |
| 4,042,884 | 8/1977 | Querry | 331/25 |
| 4,123,725 | 10/1978 | Davis | 331/36 C |

*Primary Examiner*—Donald J. Yusko
*Attorney, Agent, or Firm*—Meyer, Tilberry & Body

[57] ABSTRACT

A system is provided for gathering information concerning power consumption at different locations, generating signals corresponding to this power consumption, transmitting the signals to a selected location and conditioning the signals for recording and subsequent analysis by computer. The signals have frequencies proportional to the power consumption monitored plus a preselected offset frequency which can be synchronized with an outside source such as the line frequency of readily available power lines.

19 Claims, 6 Drawing Figures

SYSTEM FOR MONITORING, TRANSMITTING AND CONDITIONING OF INFORMATION GATHERED AT SELECTED LOCATIONS

BACKGROUND OF THE DISCLOSURE

A national energy policy has been proposed by the Federal Administration and is currently being implemented through Federal Legislation. Some of the elements of this national energy policy require vastly improved and extended means of gathering and processing data on electric power generation and consumption. To better conserve energy, the Federal Agencies governing power production and distribution are requiring utilities to gather information for the possible implementation of different means of billing the ultimate user for power. These agencies are currently considering the charging of different prices for electric energy at different times of the day and for different seasons. These two techniques are known as "time-of-day rates" and "seasonal rates". A third measure is charging reduced rates for power which may be interrupted at the option of the power company. All of these measures will conserve energy by making it cheaper for consumers to use energy during periods of low overall consumption. At these times, "peaking units" are not in use and the energy being consumed is produced by the most efficient "base-load units". "Peaking units" are the power company's least efficient generating units. Some are designed to be easily brought into operation when a quick increase in power demand is encountered. They often run on expensive natural gas or diesel fuel. "Base-load units" are the power company's most efficient units and normally are kept running at all times. Efficient coal-fired and nuclear plants are "base-load units". These types of billings, in effect, encourage the use of electricity produced by the most efficient means, the "base-load units". The implementation of these programs can be aided by studies using remote metering and billing using remote metering.

Remote metering is also being encouraged and may be required in the supply of electric power to large buildings. In the past, many large buildings, such as multiple unit apartment buildings, have been metered at only a single point and have received only a single bill for electric power. This is called "master metering". Under Section 115 of the Public Utilities Regulatory Policy Act of 1978, "master metering" on certain types of new large buildings is prohibited. Further, the reduction of existing "master meter" installations is encouraged. By individually metering each dwelling unit in a large building and billing the actual user for the power consumed, it is believed that the user will be encouraged to conserve power. To implement this, meters will be installed for each unit in new buildings. For older buildings, individual metering in the conventional manner would require rewiring the entire building with heavy power carrying conductors. In many structures this is not economically feasible.

The Federal Government is also considering exempting certain power uses from its power conservation policies. Certain "life line" services would be required to be billed separately at a price not directly related to cost of production. Thus, electric power for federally mandated essentials such as cooking and lighting would have to be supplied to some customers at a different rate than "non-essential" power for television sets and the like. All of these individual programs within the national energy policy will require extensive metering, load studies, and information processing by utility companies.

Additionally, under the Power Plant Industrial Fuel Use Act of 1978 monitoring of coal, oil and gas used in the production of electricity and the efficiency of this use will be necessary. A flexible, low cost and portable system to monitor various elements in the overall fuel use system will greatly ease performance of these tasks. For example, a system of monitors on a gas turbine peaking unit measuring gas consumption, electric output, the temperature of exhaust fumes, and other variables and recording these values and the time of day may be of use in determining and improving the efficiency of the unit in its particular installation.

All of the above discussed situations commend inexpensive, portable, rugged and light weight monitoring systems. Further, the information monitored must be presented in a form usable to a digital computer as the only practical means presently known to the inventors to assimilate and evaluate the large amounts of information collected over an extended period of time is by means of a digital computer. One such system is described in U.S. Pat. No. 3,135,573, issued to the present inventors. Other systems for data collection known to the inventors are not as readily adaptable to cope with this type of information retrieval challenge. These other systems have been used by the electrical power generating industry in the past for studies of power consumption or "load studies". However, the need for more comprehensive and current "load studies" has greatly increased over the past several years because of the noted greater public and governmental interest in conserving electric power, thereby rendering these other systems at least partially obsolete. Utility companies must now know much more about how power is currently used in order, as aforesaid, to devise effective means to conserve it. The cost of producing power used in various applications must also be determined in order to develop compensatory prices which encourage proper energy utilization and conservation.

Accordingly, the conception of this invention has been to provide an improved system which is even more useful and adaptable for monitoring numerous devices, transmitting signals generated by this monitoring process to a receiver and for conditioning the signal so that it is easily recordable on magnetic tape or other means useable in a digital computer.

SUMMARY OF THE INVENTION

The present invention contemplates a new and improved system for gathering, transmitting, processing and recording information which is solid-state, highly reliable, and capable of transmitting information over any of a number of media with high immunity to electrical interference.

Briefly, stated, in accordance with one aspect of the invention, there is provided a system using an electrical transmitter which produces a signal having a frequency proportional to the quantity of power being measured plus a specified offset frequency representing a "zero value" for the quantity being measured. Thus, if power consumption by a device is measured, zero power consumption is represented by a predetermined offset frequency such as 60 Hz. An increase in power consumption will cause a proportional increase in the frequency of the signal. This transmitted signal is received by a receiver at a selected point and the received signal is amplified and processed so that it may easily be recorded on magnetic tape or some other memory device for later analysis by a digital computer.

It is among the objects of this invention to provide:

a system using a transmitter to produce a signal having a frequency proportional to the quantity being measured plus a specified offset frequency representing a zero value for the quantity being measured which can be synchronized with a readily available reference frequency such as the 60 Hz frequency of standard alternating current commercial power;

a system using a transmitter having a selectable carrier frequency which is altered by modulation with a signal proportional to the quantity of the variable measured plus a specified offset frequency;

a system having a number of pairs of transmitters and receivers for transmitting information over a media to a selected location and an adder circuit comprised of a memory unit and logic gate triggering means for each transmitter-receiver pair and a clock driven enabling means whereby such adder can combine signals from numerous receivers on a single magnetic memory without masking elements of a signal from one receiver with a signal from another receiver;

a system which can remove the specified offset frequency at the receiver, thereby making the present invention compatible with pre-existing systems;

a method for producing a signal having a frequency proportional to the quantity being measured plus a specified offset frequency representing a "zero value" for the quantity, transmitting this signal to a receiver and processing this signal so it may be recorded for later analysis by a digital computer;

a method producing a signal having a frequency proportional to the quantity being measured plus a specified offset frequency synchronized with a readily available reference frequency, transmitting this signal to a receiver and processing this signal so it may be easily recorded for later analysis by a digital computer;

a method for measuring a quantity, producing a signal having a frequency proportional to this quantity plus an offset frequency synchronized with the alternating current power on available power lines, frequency modulating a carrier with this signal, transmitting this frequency modulated carrier over the available power lines to a receiver at a selected point and processing the received signal so it may be recorded for analysis by a digital computer;

a method for adding a number of pulse signals together by applying each such signal to a first set of memory devices and sequentially interrogating these memory devices to determine if they have received a pulse at a rate higher than the highest expected pulse rate of any individual signal;

a versatile system for transmitting and processing information in a manner which protects the information transferring signal from electrical interference and especially low frequency interference; and a monitoring system which has increased accuracy and electric interference immunity and uses frequency modulation of a transmitted signal to convey information concerning the quantity measured and a non-zero lower limit of modulation representing a zero condition for said quantity.

Further objects and advantages of the invention will appear in the following description of the preferred embodiment of the invention. This embodiment is specifically suited to a system using utility line coupling of the transmitter to the receiver. In this mode, the output of the transmitter is coupled to electric power lines which carry the signal to the receiver. Other types of coupling such as optical fibers, fine wires or electromagnetic radiation coupling may also be used.

DESCRIPTION OF THE PREFERRED EMBODIMENT

The present invention will be described with particular reference to monitoring electric power consumption, such as power consumed by individual appliances in residential and industrial buildings including electric ranges, air conditioners, power tools, heating elements and various other appliances. However, it should be appreciated that the invention has a much broader application and may be advantageously used in gathering diverse types of information in other fields of use.

Figure 1:
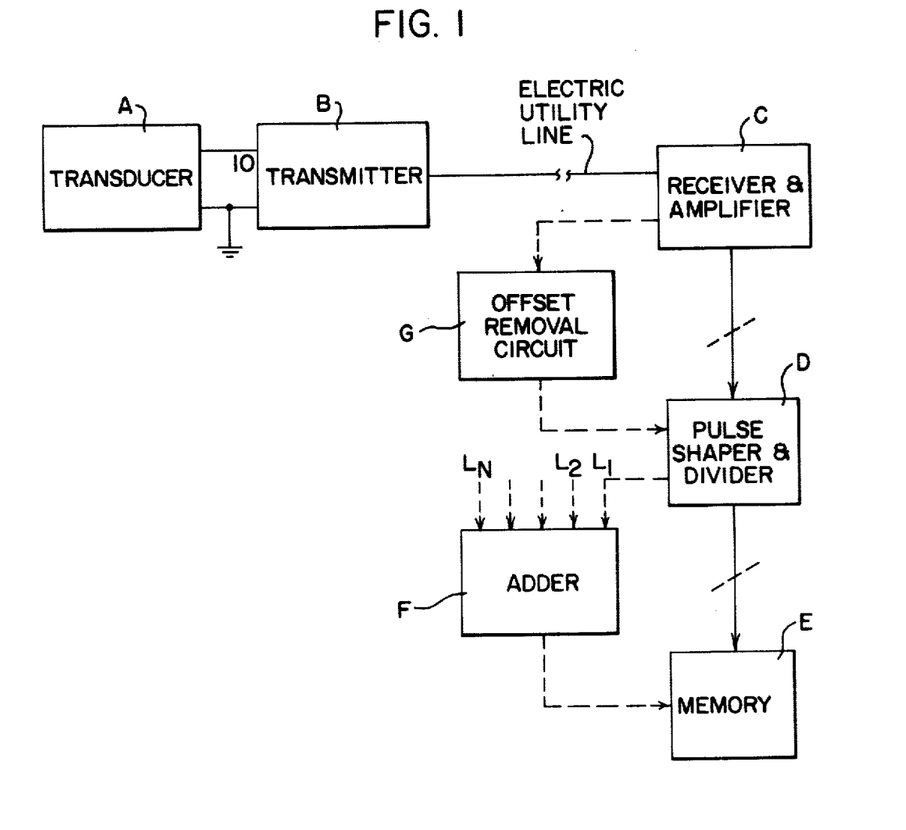
FIG. 1 is a block diagram relating to the major segments of the preferred embodiment.

Referring now to the drawings, wherein the showings are for the purpose of illustrating the preferred embodiment of the invention only and not for the purpose of limiting same, FIG. 1 illustrates the major components of the preferred system. Transducer A provides a voltage at the input 10 of the transmitter B proportional to the quantity being measured. A Hall-effect transducer is commonly used to measure electric power consumption and is used here. The voltage output of this device is proportional to the power consumed by the circuit to which it is connected.

The transmitter B, shown in detail in FIG. 2, converts the transducer voltage to a high frequency signal for transmission over utility lines in a manner described below. A receiver C, shown in detail in FIG. 3, is coupled to the utility line at a convenient point. The receiver isolates, demodulates and amplifies the signal. This signal is processed in the pulse shaper divider D, shown in FIG. 4, for recording in the memory E. Adder F can be used to combine pulses from a number of dividers, $D_1$ through $D_N$, and record the sum of these pulses in memory E. Offset removal circuit G can be used to remove the zero level offset from the signal at the receiver, making this unit compatible with similar units produced in the past.

Several integrated circuit part numbers are given in the following description as preferred parts. Those skilled in the art will realize that other similar parts may, in many cases, be substituted without detriment to the system as a whole and, in certain applications, may improve performance.

The Transmitter

Figure 2:
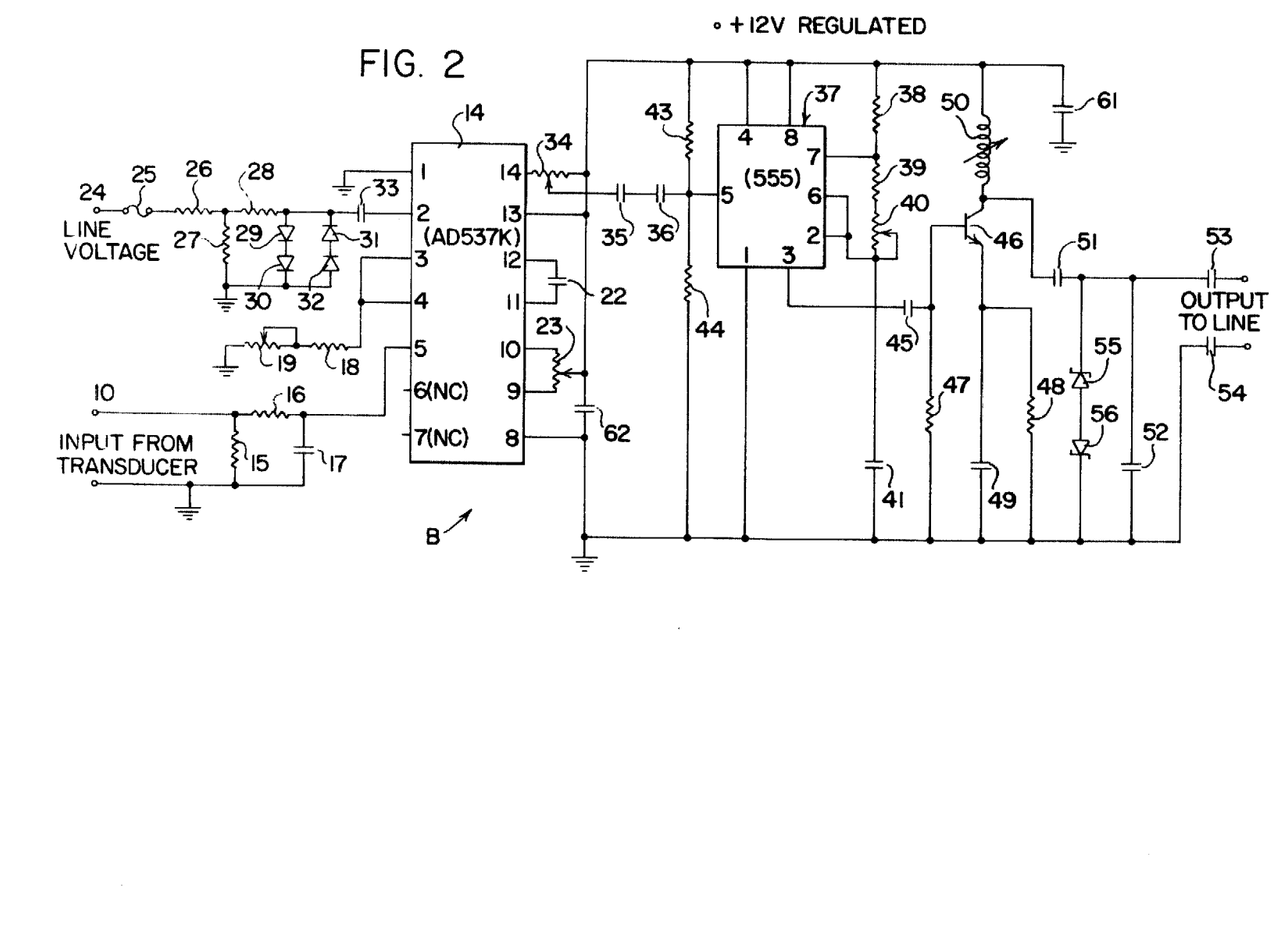
FIG. 2 is a schematic diagram of the transmitter portion of the preferred embodiment of the present invention.
Figure 3:
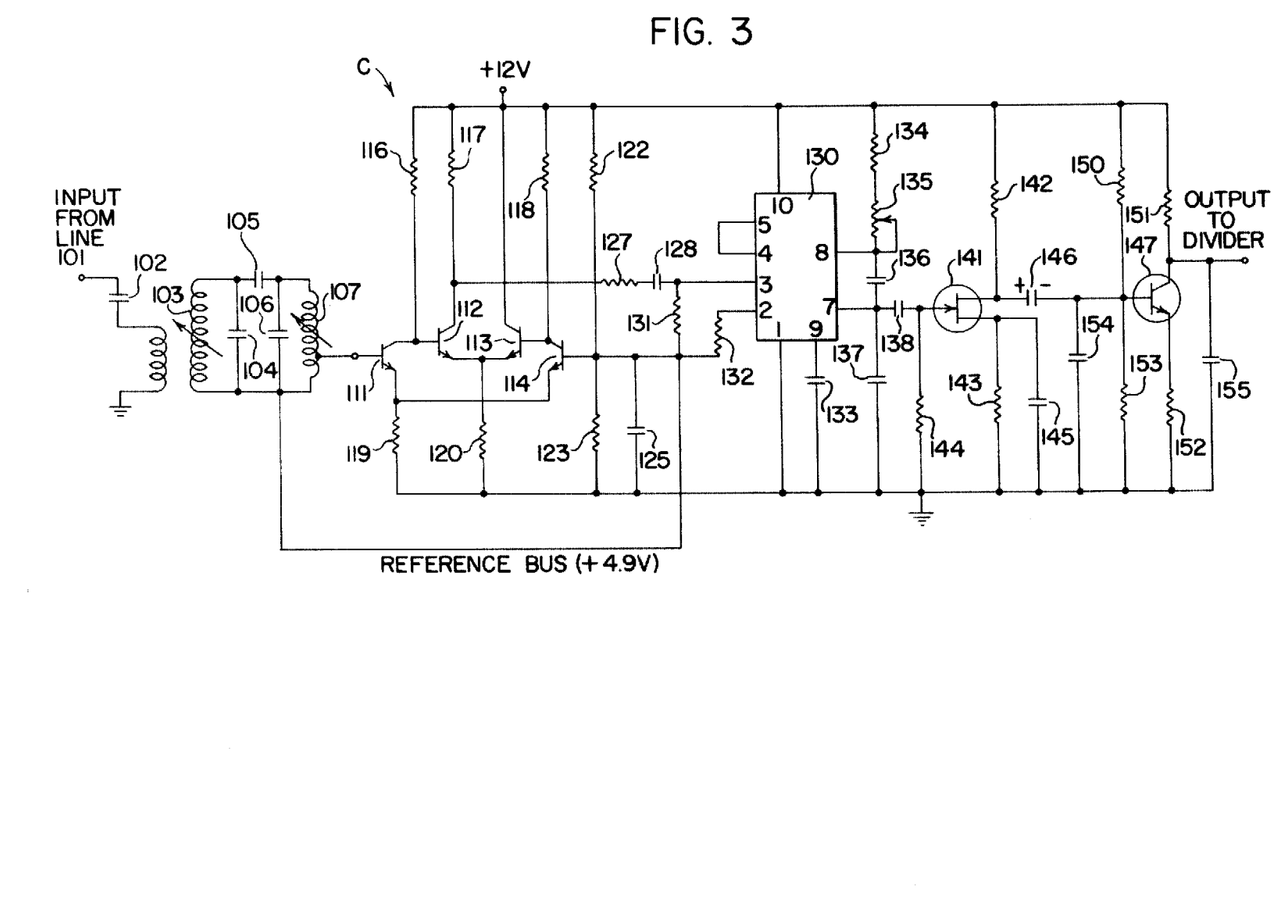
FIG. 3 is a schematic diagram of the receiver and amplifier section of the preferred embodiment of the present invention.

Referring now to FIG. 2, the transducer output voltage is applied to a voltage-to-frequency converter 14. The converter used in the preferred embodiment is an integrated-circuit voltage-to-frequency converter from Anolog Devices and is identified by the part number AD537K. The positive output of the transducer is applied to positive input 10 of the transmitter B through resistors 15, 16 and capacitor 17 to the voltage input of the voltage-to-frequency converter 14. Resistor 15 provides the required loading to the Hall-effect transducer. Resistor 16 and capacitor 17 smooth out the high ripple content to achieve highest accuracy. Resistor 18 and potentiometer 19 are connected in series between pins 3 and 4 of the converter 14, and ground. The values are selected and the potentiometer adjusted to select the gain or full scale frequency desired. Capacitor 22 connected between pins 11 and 12 is selected in conjunction with resistors 18 and 19 to set the highest output frequency corresponds to what is conventionally known in metering technology as "full scale deflection". Potentiometer 23 connected between pins 9 and 10 adjusts the offset frequency of the converter. This sets the nonzero frequency representing a "zero input" voltage.

It is desirable in many applications to have a nonzero output frequency from the voltage-to-frequency converter 14 representing a "zero input" voltage. In this way, problems associated with very low frequency signals can be avoided. To maintain accuracy and consistency of this frequency from unit to unit, it would be best if this offset frequency could be locked or synchronized to a readily available outside reference. This is accomplished in the present invention by supplying a reference signal through a pull-in circuit at pin 2 of the converter. The pull-in circuit is supplied with line voltage from a commercial power utility through the power supply transformer secondary lead 24 and link 25. Resistors 26 and 27 divide the voltage to a value more easily usable to the pull-in circuit. Resistor 28 limits the current to the circuit. Diodes 29, 30, and 31, 32 are connected to insure that not more than 1.5 volts is applied between terminal 2 of the voltage-to-frequency converter and ground. Two of these diodes will always be conductive, thereby guaranteeing that twice the forward voltage drop of the diode is the maximum voltage applied to pin 2. Capacitor 33 further protects synchronizing pin 2 of the voltage-to-frequency converter from any dc component or spurious line signals in the pull-in circuit. Because utility line voltage is available system-wide and will have the same frequency regardless of location, it is an ideal reference frequency. All transmitters operating within an interconnected system will have identical offset frequencies. The timing signals normally recorded with the signals under discussion at the receiver will also be based on line frequency. All transmitters and receivers thus will be synchronized to the same offset frequency.

The output of the voltage-to-frequency converter 14 is a square wave signal having a frequency proportional to the voltage supplied by the transducer plus the offset frequency regulated by the pull-in circuit. This output is applied to a potentiometer 34 which is also connected to the positive supply voltage. In this manner, the amplitude of the output pulses can be easily varied by adjusting the potentiometer 34.

Three potentiometer controls are provided in conjunction with the voltage-to-frequency converter. The first, potentiometer 19, is the scale adjustment and is used to set the upper frequency value of the output pulses at full load. The frequency range of the output device can thereby easily be set to provide maximum noise immunity in transmission and the optimum pulse rate for the information being transmitted. The second, potentiometer 23, roughly sets the offset frequency. Ideally, this offset frequency is set one or two hertz (Hz) below the frequency of the pull-in circuit frequency and the pull-in circuit frequency will pull the offset frequency up and lock it at the line frequency. The third, potentiometer 34, is used to control the amplitude of the output pulses of the converter 14. This will control the modulation bandwidth of the frequency-modulated oscillator to be described.

The output of voltage-to-frequency converter 14 is supplied through the potentiometer 34 and capacitors 35,36 to the input of an astable multivibrator 37 available from many sources under the part number 555 and Motorola Semiconductors under the part number MC 1555. The carrier frequency for the transmitter is determined by the selection of resistors 38,39 potentiometer 40 and capacitor 41 connected between the positive supply line and ground. Pins 2 and 6 of the astable multivibrator are connected together to one terminal of the potentiometer 40 and pin 7 is connected between resistors 38 and 39. The potentiometer 40 can be adjusted to set the desired carrier frequency within a selected range.

Resistors 43, 44 are selected to apply a D-C bias voltage of approximately two thirds the supply voltage at pin 5. Also supplied to pin 5 is the adjusted output voltage of the voltage-to-frequency converter 14. When the 555 integrated circuit is connected as described it operates as a frequency modulated oscillator, modulating the carrier frequency selected at pins 2, 6 and 7 with the signal applied at pin 5. By adjusting the amplitude of the applied signal with potentiometer 34, the modulation band-width of the frequency modulated oscillator can be adjusted for optimum transmission.

The frequency modulated carrier produced by the oscillator 37 is applied through capacitor 45 to the base of the amplifying transistor 46. The amplified carrier signal is then applied through impedance matching and isolation networks to the commercial utility line for transmission to a receiver. The amplifying transistor, a 2N1711 transistor, is biased by resistors 47, 48, capacitor 49 and adjustable inductor 50. The inductor 50 is adjusted to tune the amplifier to the carrier frequency established by the previous circuitry.

The impedance matching circuit which loads the transmitter to the utility line is comprised of two capacitors 51 and 52. Capacitors 53 and 54 couple the carrier signal to the utility line. Two zener diodes 55,56 are connected between the output of the amplifier stage and ground and protect against power line transients. Should any high voltage spikes be present on the utility line, they will be drained through the zener diodes instead of destroying the output transistor.

Capacitors 61 in the amplifier stage and 62 at the voltage-to-frequency converter 14 supply noise protection for the transmitter.

A conventional power supply (not shown) comprised of a transformer, two rectifying diodes, two capacitors and an integrated circuit regulator identified by the part number 7812 supplies 12-volt regulated dc power to all of the transmitter circuitry.

Receiver and Signal Processor

A receiver at a convenient selected point is tuned to the same carrier frequency as the transmitter located near the point of measurement. The location of the transmitter was determined by the location of the activity being observed. The receiver can be placed at any convenient position consistent with the media of transmission used. It was indicated in the transmitter description that a small amount of protection circuitry was used for the utility line coupled transmitter. The same is true in the receiver. However, other than these small isolation segments, a standardized unit can be used in almost any application. Thus, the circuitry would not differ significantly for transmission over optical fibers.

In the preferred receiver shown in FIG. 3, line 101 provides a connection to the utility line carrying the modulated carrier signal. Capacitor 102 and the primary of transformer 103 are connected in series to lead 101 and ground. Capacitor 102 readily passes the high frequency carrier while effectively blocking the low frequency line voltage. Transformer 103 can be tuned to the desired carrier frequency. Capacitor 104 is connected in parallel with the secondary transformer 103 completing the first tuned circuit. The output of this circuit is coupled by capacitor 105 to a second tuned circuit comprised of capacitors 106 and variable inductor 107. These two parallel connected tuned circuits provide good selectivity for the receiver without the need for expensive crystal or active filters. In a system using many transmitter-receiver pairs, crystal tuning circuitry could be used allowing greater selectivity and therefore more channels.

The output of the tuning circuit is applied to a differential amplifier-limiter composed of transistors 111, 112, 113, 114. Preferably, this differential amplifier and limiter is an integrated circuit. By using an integrated circuit, each transistor is built on the same substrate and will be equally affected by temperature variations or other changes in ambient conditions. Appropriate integrated circuit transistor arrays are available from RCA under part nos. CA3046 and SK 3543, General Electric Part No. IC 172 and Sylvania Part No. ECG 912.

Resistors 116, 117, 118, 119, 120 bias the four transistors. Resistors 122 and 123 form a voltage divider between the twelve volt supply bus and ground. This supplies a reference voltage at the base of transistor 114 and also supplies the elevated reference in the tuned circuit input. The reference voltage applied at the base of transistor 114 is a steady reference to which the input at transistor 111 is compared. Because this reference is also used as the common point of the tuned circuit, any supply voltage variations will be applied equally to both the reference signal and the input signal and therefore be cancelled from the output of the differential amplifier. Capacitor 125 stabilizes the reference voltage.

The differential amplifier output is applied through resistor 127 and capacitor 128 to pin 3 of a phase locked loop integrated circuit 130. This input is biased by resistor 131 and the reference voltage is applied to pin 2 through resistor 132.

The preferred phase locked loop integrated circuit is available from Signetics Corp., 811 East Arques Avenue, Sunnyvale, Calif. 94086 and identified by part number SE 565. Capacitor 133, resistor 134 and potentiometer 135 are connected to the phase locked loop as suggested by the manufacturer to select the free running frequency of the phase locked loop demodulator. The demodulated output signal is available at pin 7 and biased by capacitors 136 and 137.

The signal available at pin 7 is a square wave pulse train corresponding to the output of the voltage-to-frequency converter in the associated transmitter. This signal is applied through isolating capacitor 138 to the base of a field effect transistor 141. The field effect transistor is used because it has a high impedance input and will not drain the high impedance output of the phase locked loop. Resistors 142, 143, 144 and capacitor 145 bias the field effect transistor. A second amplifier stage is fed through isolation capacitor 146. This second stage is a bi-polar transistor 147 biased by resistors 150, 151, 152, 153. Capacitors 154 and 155 comprise low-pass filters permitting the signal to pass while grounding any high frequency carrier signal. The output of the amplifier stages is applied to a monostable multivibrator shown in FIG. 4 through an isolating capacitor 161. The monostable multivibrator shapes the pulses received from the amplifier and assures that they are of good form for digital processing. The integrated circuit used is identified by part number 555 and is preferably the same integrated circuit used as an astable multivibrator in the transmitter circuit. This minimizes the number of different parts required.

Figure 4:
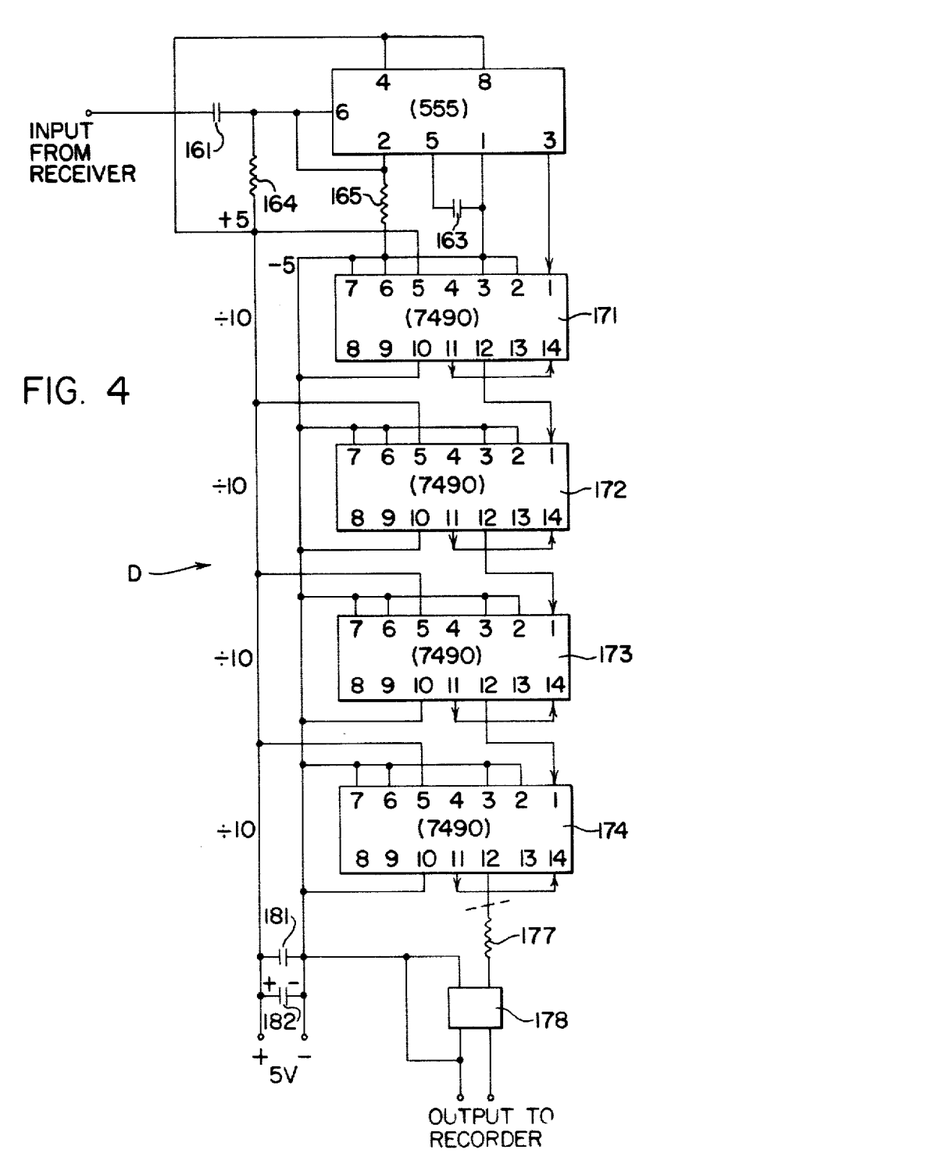
FIG. 4 is a schematic diagram of the pulse shaping and dividing network associated with the receiver in the preferred embodiment of the present invention.

Bi-polar power is applied to the monostable multivibrator at pins 8, the plus power pin, and pin 1, the minus power pin. The power is supplied from a five volt bi-polar precision supply which is also used to supply power to the later described divider network integrated circuits. This power supply (not shown) is conventional.

Capacitor 163 is a bypass capacitor placed to minimize noise problems.

Resistors 164, 165 form a voltage divider between the plus 5 and minus 5 voltage supply buses thereby supplying a zero reference level at the input pins 6 and 2 of the monostable multivibrator. The input is also connected at these points. The output of the multivibrator is supplied at pin 3 and is a clean square wave which is supplied to the divider network.

The divider network is composed of four decade counters 171, 172, 173, 174. Each counter is a TTL integrated circuit decade counter identified by part number 7490 and available from numerous sources. The output of the monostable multivibrator is applied at pin 1 of the first counter chip 171. The output of this chip is in turn connected to the input of the next chip 172 whose output is connected to the input of chip 173 which is connected to chip 174. Thus, the divider provides a maximum division of 10,000. This output is supplied at pin 12 of integrated circuit 174.

The constant of division can be altered by either adding additional stages to divide by a number larger than 10,000 or by taking the output at pin 12 of earlier stages to divide by 1,000, 100, or 10. Additionally, divisions by other than decade amounts can be obtained by using a pin other than pin 12 of the 7490 integrated circuit for its output. Thus, a division by 500 can be obtained by using pin 11 of integrated circuit 173 as the output.

In the preferred embodiment shown, the output of the divider network is supplied at pin 12 of integrated circuit 174 through resistor 177 to an optical coupler 178. The optical coupler is a light emitting diode and photosensitive transistor contained in a single package. It is used to electrically isolate the counters from succeeding devices. The output of the optical couplers is available for recording on a tape recorder or other memory device so that the information transmitted is available for later analysis in a digital computer.

An example of how the system can operate is described below. The transmitter is set to provide pulses varying between 60 Hz for a no load condition (zero power consumption) and 560 Hz for a 100 watt load. These signals are frequency modulated, transmitted, received, demodulated and divided by 10,000. The output of the optical couplers therefore varies between 0.36 cycles per minute at no load and 3.36 cycles per minute for a 100 watt load. This pulse rate range is ideal for recording on one track of a magnetic tape for utility company load studies or remote monitoring of power consumed for billing purposes. The pulses provided by the invention are recorded on one track of a two track tape and a timing signal is recorded on the other track. The timing signal is produced by an electric clock mechanism and will also be based on the utility line frequency. The values of the components used in this embodiment of the invention are listed below.

TABLE OF COMPONENTS

| RESISTORS (In OHMS) | | CAPACITORS (IN MICROFARADS) | |
|---|---|---|---|
| NO. | NO. | NO. | NO. |
| 15 50 | 119 1.5 K | 17 56 | 104 0.0039 |
| 16 560 | 120 390 | 22 0.00168 | 105 0.1 |
| 18 1060 | 122 1.2 K | 33 0.02 | 106 0.0039 |
| 19 100 | 123 820 | 35 40 | 125 40 |
| 23 20k | 127 3.9k | 36 40 | 128 0.001 |
| 26 1k | 131 620 | 41 0.00056 | 133 .00056 |
| 27 3.3k | 132 620 | 45 0.0022 | 136 0.001 |
| 28 10k | 134 470 | 49 10 | 137 0.002 |
| 34 5k | 135 10k | 51 0.022 | 138 0.1 |
| 38 1k | 142 10k | 52 0.047 | 145 40 |
| 39 3.3k | 143 4.7k | 53 0.1 (600v) | 146 2 |
| 40 10k | 144 560k | 54 0.1 (600v) | 154 0.01 |
| 43 560k | 150 150k | 61 10 | 155 0.005 |
| 44 100k | 151 20k | 62 0.01 | 161 0.01 |
| 47 2.7k | 152 1.6k | 102 0.1 (600v) | 163 0.01 |
| 48 10 | 153 15k | | 181 0.01 |
| | | | 182 10 |
| 116 5.6k | 164 100k | INDUCTORS & TRANSFORMER | |
| 117 510 | 165 100k | (103, 107 & 50) ARE SELECTED | |
| 118 5.6k | 177 470 | TO BE TUNABLE TO THE DESIRED CARRIER FREQUENCY CAPACITORS 104, 106 ARE SELECTED TO FORM RESONANT CIRCUITS WITH THE INDUCTORS | |

OPTIONAL FEATURES

Figure 5:
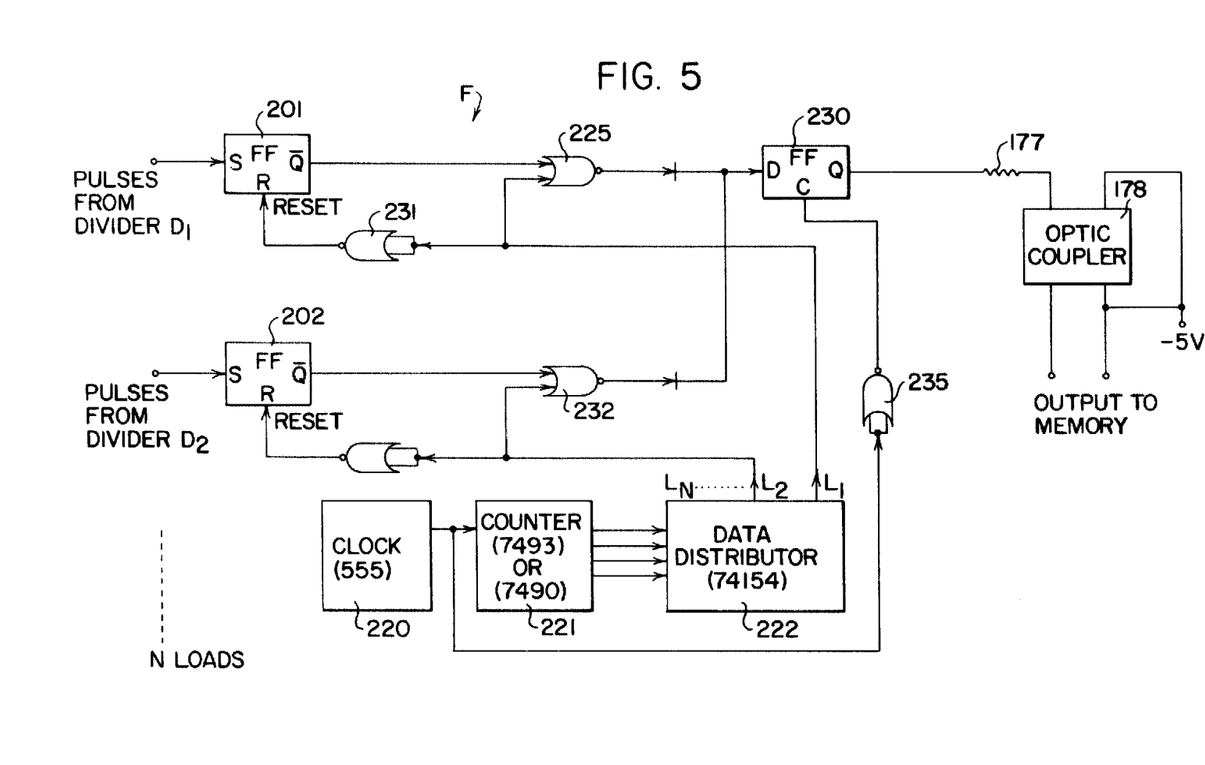
FIG. 5 is a schematic diagram of the adder circuit for combining pulses from a number of dividers into one data stream; and, FIG. 6 is a schematic diagram of a circuit for removing the selected offset frequency added to the signal at the transmitter from the signal at the receiver.

The circuit illustrated in FIG. 5 adds pulses from a number of different receivers and produces a total for recording in memory. This is useful where the total power consumed by a number of devices or circuits is desired to be recorded. The output from the dividers of the receivers for each device $D_1$, $D_2$ cannot be simply tied together because overlapping pulses would be counted as a single pulse and errors would result.

The circuit illustrated can add data from up to sixteen separate receivers. Each flip-flop is read and reset in turn and, if the flip-flop is set, a pulse is generated for the optical coupler 178.

Set-reset flip-flops 201,202 receive pulses from each divider $D_1$, $D_2$, $D_N$ associated with a receiver for each device being monitored. The output of the last divider stage 174 is disconnected from resistor 177 in FIG. 4 and applied to the set terminal S of the appropriate flip-flop. When a pulse occurs, the flip-flop is set and the $\overline{Q}$ terminal goes to zero, at all other times $\overline{Q}$ remains at one.

Clock 220 is set to pulse at a frequency greater than the product of the number of receivers to be interrogated and the highest pulse frequency expected from any receiver. The 555 integrated circuit previously discussed can be adjusted to provide the clock rates anticipated.

The clock pulses are applied to a counter 221, a divide by sixteen counter (Part No. 7493) or, if less than ten receivers are being added, the divide by ten counter (Part No. 7490) used elsewhere in the invention. The counter 221 drives a one of sixteen data distributor 222 (Part No. 74154) which has sixteen output lines $L_1$, $L_2$, $L_N$. All lines $L_1$, $L_2$, $L_N$ are held at logic one except the line addressed by counter 221 which goes to logic zero.

A zero on line $L_1$ will enable NOR gate 225 thereby reading flip-flop 201 and applying its output to flip-flop 230. If terminal $\overline{Q}$ is in the zero state, indicating a pulse has been received from divider $D_1$, flip-flop 230 will be set. If terminal $\overline{Q}$ is in the one state, indicating no pulse has been received from divider $D_1$, flip-flop 230 will not be set.

The zero on line $L_1$ is also applied to gate 231 which inverts the zero to a one and delays it. The output of gate 231 is applied to the reset terminal R of flip-flop 201 which clears the flip-flop, readying it for the next cycle. Gate 235 resets flip-flop 230 after each clock pulse in a similar manner.

While flip-flop 201 is being interrogated, each line $L_2$, $L_N$ other than $L_1$ is held at one, disabling logic gate 232 and all other similar gates. Thus, only one flip-flop is read at a time. The distributor cycles through all sixteen lines $L_1$, $L_2$, $L_N$ at a cycle rate higher than the highest pulse rate expected from any divider $D_1$, $D_2$, $D_N$. This guarantees that no pulses are missed or overlap and the number of pulses applied to resistor 177 and the optical coupler 178 is the sum of all pulses received from all the dividers.

A second optional circuit, shown in FIG. 1 as block G, the offset removal circuit, can be used to remove the zero level offset frequency introduced at the voltage-to-frequency converter in the transmitter. This is desirable when the present invention is utilized in systems employing older units not having an offset frequency. The output of the present invention will then vary in a manner identical to the output of the older devices.

In systems employing units using the present invention exclusively, this offset removal is neither necessary nor desirable. The presence of the selected offset frequency conveys information and can be easily dealt with by a computer in the recorded data.

The offset removal circuit is inserted as shown in FIG. 1 by breaking the connection between the receiver/amplifier C and the pulse shaper/divider D. The offset removal circuit G is then inserted between these two blocks.

Figure 6:
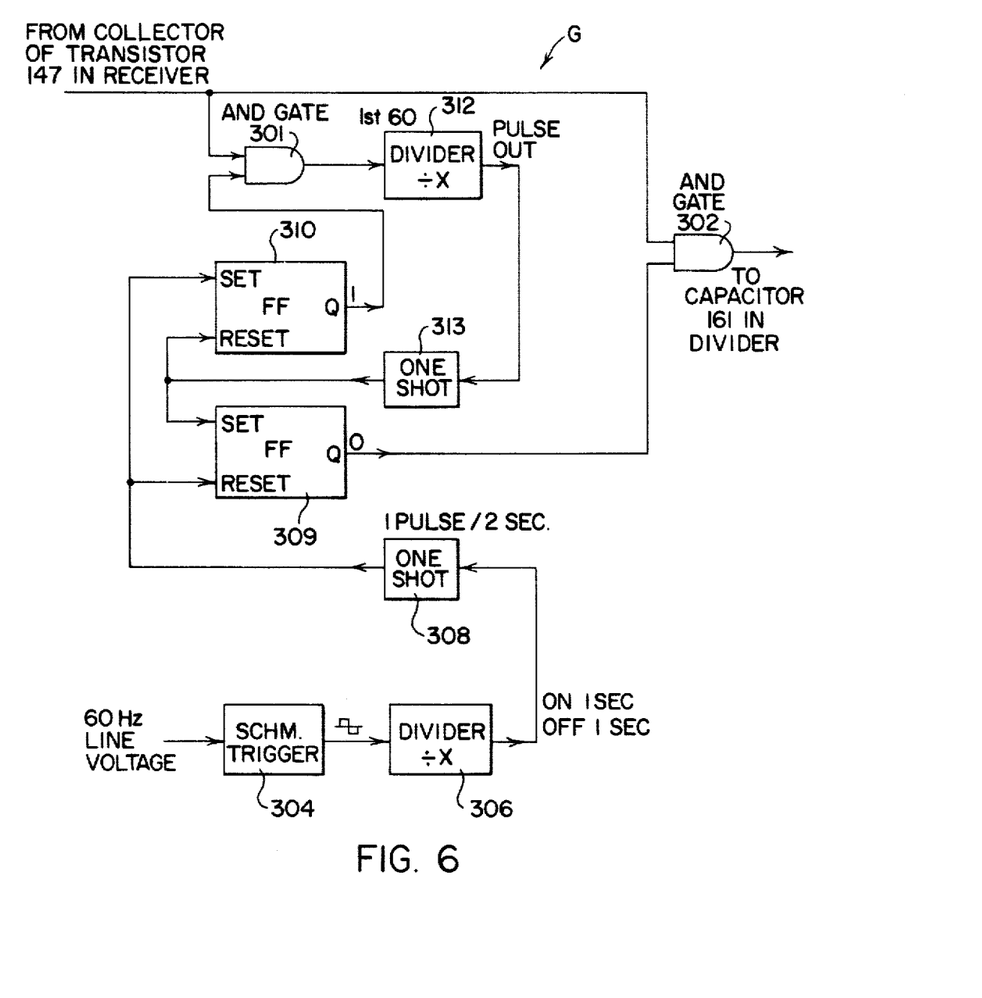

The 60 Hz line voltage used to synchronize the offset frequency of the transmitter is also available at the receiver and is used here. The line voltage is applied to Schmitt trigger 304 which in turn drives divider 306 and one shot 308. The divider reduces the 60 Hz frequency of the line voltage to a ON/OFF signal having a frequency more easily usable in this circuit. As an example, a division by 120 can be used resulting in a signal ON for one second and OFF for one second. In this example, one shot 308 will provide a pulse once every two seconds.

Two flip-flops 309,310 compare the signal received from the output of the receiver to the line voltage frequency. This is done by first dividing the two signals by the same amount, conditioning them and applying them to the inputs of the flip-flop 309,310. Thus, in the example under discussion both divider 306 and divider 312 will divide the signal applied to its input by 120. When a pulse is received at the set input of flip-flop 310 the output Q goes high and enables AND gate 301. This allows pulses from the output of the receiver at the collector of transistor 147 to pass through the AND gate 301 and increment divider 312. When divider 312 reaches the appropriate value, one shot 313 is activated applying a pulse to the reset of flip-flop 310 causing its output to go low disabling AND gate 301. The same pulse from one shot 313 sets flip-flop 309 causing its output to go high enabling AND gate 302. Once AND gate 302 is enabled, pulses from the collector of transistor 147 in the receiver pass through the AND gate to capacitor 161 in the input of the pulse shaper shown in FIG. 4.

One shot 308 will always pulse at a constant rate as it is driven by the 60 Hz line frequency. Flip-flop 310 will be set at a constant rate and flip-flop 309 will be reset at a constant rate regardless of the signal received from the receiver. With flip-flop 310 set and flip-flop 309 reset, AND gate 301 is enabled and AND gate 302 is disabled. Pulses from the receiver will be applied to the divider 312 but will not pass through AND gate 302 to capacitor 161 in the pulse shaper/divider network. The pulses from transistor 147 in the receiver will be counted by divider 312 until a number equal to that required to activate one shot 308 is reached. Then one shot 313 will be activated resetting flip-flop 310 and setting flip-flop 309. A number of pulse equal to that counted on the power line has been removed from the signal. Flip-flop 309 will then enable AND gate 302 and flip-flop 310 will disable AND gate 301. Pulses will pass from the receiver to the pulse/shaper divider network and will not increment dividers 312. This circuit will remain in this state allowing the signal from the receiver to pass to the pulse shaper until the next pulse is received from one shot 308.

The above described sequence of events results in the following. After one shot 308 pulses, AND gate 302 will be disabled and 301 will be enabled for a number of pulses determined by the choice of identical dividers 306,312. Once this number of pulses is received from transistor 147, AND gate 302 will be enabled and AND gate 301 will be disabled. This state will be maintained until divider 306 receives this same number of pulses from the 60 Hz line voltage. Once this occurs, flip-flop 310 is once again set and flip-flop 309 is reset starting the process all over again. A number of pulses equal to the line frequency applied to Schmitt trigger 304 is thereby removed from the pulse train at transistor 147 in the receiver circuit. The offset frequency is thereby removed.

If the quantity being measured has a zero value, the frequency of pulses from transistor 147 will be identical to the line frequency and counters 306 and 312 will finish their counts at the same time. No pulses will be passed to capacitor 161. If the quantity has a non-zero value, divider 312 will finish its count first and allow pulses to pass to capacitor 161.

Second Embodiment

Another embodiment of the present invention uses a cable containing two fine wires in a metalic shield to connect the transmitter to the receiver. This type of installation can be most advantageously used in converting present large structures, such as multi-unit apartment buildings, which have a single meter so that each unit may be independently metered and billed.

By using the present invention, small, unobtrusive transmitters can be installed in each apartment unit and small two wire shielded signal carrying cables can be wired to the building. As these cables carry only low power signals, they are much more easily installed and do not require the safety precautions of heavy power cables. Local electrical code requirements are also more easily and cheaply met with this low power wire.

This type of installation requires much less hardware than the power line coupled embodiment just described. The transmitter consists only of the transducer, voltage-to-frequency converter and synchronizing pull-in circuit, already described. The frequency modulated oscillator and amplifier are not required. Instead, the output of resistor 34 is applied directly to the two wire shielded cable. Also, the power supply is not required as power is supplied through the two wire cable from the receiver.

The receiver in this embodiment uses none of the circuitry of FIG. 3. Instead, the signal wire of the two wire cable is connected directly to integrated circuit 162. The monostable multivibrator 162 and divider network 171, 172, 173, 174 are the only elements necessary in the receiver. The power supply used to power the receiver also supplies power to the transmitter over the second line in the two wire cable. The metallic shield of the two wire cable supplies a common power and signal ground.

This second embodiment uses a line frequency synchronized offset frequency in the same manner as the preferred embodiment but does not use the FM modulated carrier. Thus a 60 Hz (United States line frequency) signal is always present and a zero level is precisely set. Malfunctions in the transmitter or receiver are easily identified by the absence of a 60 Hz zero reference at no load.

Any other reference frequency, such as 50 Hz European line frequency may also be used.

Having thus described the invention it is now claimed:

1. Apparatus for recording information at a first location related to a quantity measured at a second location comprising:
   (a) a receiver at said first location for receiving a signal;
   (b) a signal processor having pulse shaping means, first divider means and coupling means;
   (c) a source of alternating current of constant frequency available at said first location and said second location;
   (d) recording means for recording said information and reference information based on said alternating current constant frequency;
   (e) a transducer at said second location adapted to measure a quantity; and
   (f) a transmitter at said second location, said transmitter having an input connected to said transducer, a converter having an output signal with a frequency proportional to the quantity measured by said transducer plus a preselected offset frequency equal to said alternating current constant frequency.

2. The apparatus of claim 1 wherein said transmitter includes a pull-in circuit connected to a source of alternating current of constant frequency and means to synchronize said preselected offset frequency to said constant frequency.

3. The apparatus of claim 2 wherein said transmitter includes means to frequency modulate a carrier signal of selected frequency with said converter output signal and said receiver includes means to detect said converter output signal from said modulated carrier signal.

4. The apparatus of claim 2 wherein means are provided at said first location adapted to subtract said preselected offset frequency from said signal.

5. Apparatus for recording information at a first location related to a quantity measured at a second location comprising:
   (a) a receiver at said first location for receiving a signal;
   (b) a signal processor having pulse shaping means, first divider means and coupling means;
   (c) a source of alternating current of constant frequency available at said first location and said second location;
   (d) recording means;
   (e) a transducer at said second location adapted to measure a quantity;
   (f) a transmitter at said second location, said transmitter having an input connected to said transducer, a converter having an output signal with a frequency proportional to the quantity measured by said transducer plus a preselected offset frequency equal to said alternating current constant frequency, a pull-in circuit connected to said source of alternating current of constant frequency synchronizing said preselected offset frequency to said constant frequency; and,
   (g) means provided at said first location adapted to subtract said preselected offset frequency from said signal, said subtracting means being synchronized to the same source of alternating current as said transmitter.

6. The apparatus of claim 5 wherein said subtracting means includes second divider means having a single pulse output for a first selected number of cycles of said synchronizing alternating current, first and second memory means connected to the output of said second divider means, said first memory means being adapted to actuate first enabling means when set, said first enabling means connected to the output of said receiver, third divider means adapted to be connected to said first enabling means having a single pulse output for a second selected number of input cycles from said enabling means, said first and second selected numbers for said second and third divider means being the same, the output of said third divider means being connected to said first and second memory means and said second memory means being adapted to actuate a second enabling means, said second enabling means having an input connected to said receiver and an output connected to said signal processor.

7. The apparatus of claim 3 wherein said transmitter output is connected to an alternating current power line, said receiver being connected to said power line and said source of alternating current of constant frequency is also said power line.

8. Apparatus for recording information at a first location related to the sum of a plurality of quantities measured at a plurality of second locations comprising:
   (a) a plurality of receivers at said first location;
   (b) adder means adapted to combine the signals from all of said receivers;
   (c) recording means;
   (d) a plurality of transducers at said plurality of said second locations, each said transducer associated with one of said plurality of receivers;
   (e) a plurality of transmitters at said plurality of said second locations each said transmitter associated with one of said transducers, said transmitters each having an input connected to one of said associated transducers, a converter having an output signal having a frequency proportional to the quantity measured by said associated transducer plus a preselected offset frequency; and
   (f) means to convey each converter output signal to an associated receiver.

9. The apparatus of claim 8 wherein each said transmitter includes a pull-in circuit connected to a common source of alternating current of constant frequency and means to synchronize said preselected offset frequency to said constant frequency.

10. The apparatus of claim 9 wherein each said transmitter includes means to frequency modulate a carrier signal of selected frequency with said converter output signal and said receiver includes means to detect said converter output signal from said modulated carrier.

11. The apparatus of claim 10 wherein said means to convey said converter output signal are power lines and said common source of alternating current of constant frequency are also said power lines.

12. The apparatus of claim 11 wherein said adder means is comprised of a set of first resettable memory means, one of said first resettable memory means being associated with each of said receivers and adapted to receive the output of said receiver, a clock adapted to generate a signal having a frequency equal to or greater than the product of the number of receivers and the highest frequency expected from any single receiver, second resettable memory means, switch means connecting each of said set of first resettable memory means to said second resettable memory means adapted to sequentially apply the output of each of said set of first resettable memory means to the input of said second resettable memory means at a rate determined by said clock and means adapted to reset said second resettable memory means after each of said set of first resettable memory means has been read.

13. A method for recording information at a first location related to a quantity measured at a second location comprising: monitoring said quantity, producing a first signal having a frequency proportional to said quantity plus an off-set frequency synchronized with power line frequency, transmitting said first signal to said first location, dividing the frequency of said first signal thereby producing a second signal proportional to said first signal and recording said second signal on a recording media synchronized with line frequency.

14. A method for recording information at a first location related to a quantity measured at a second location comprising: monitoring said quantity, producing a first signal having a frequency proportional to said quantity plus a selected offset frequency synchronized with an external source of alternating current, transmitting said first signal to said first location, dividing the frequency of said first signal thereby producing a second signal proportional to said first signal and recording said second signal and a signal based on the frequency of said external source of alternating current.

15. The method of claim 14 wherein said first signal is frequency modulated onto a selected carrier frequency before transmission and detected at said first location.

16. The method of claim 15 wherein said frequency modulated carrier frequency is transmitted over power lines and said power lines are also said external source of alternating current.

17. A method for recording at a first location information related to the sum of a plurality of quantities measured at a plurality of second locations comprising: monitoring said quantities at each of said second locations, producing a set of first signals having a frequency proportional to said quantities plus a common selected offset frequency, transmitting said set of first signals to said first location, dividing the frequency of each of said set of first signals producing a set of second signals proportional to said set of first signals, applying each of said set of second signals to a memory device, sequentially interrogating and clearing each said memory device at a frequency greater then the highest frequency expected in said set of second signals, producing a pulse for each time one of said memory devices is found activated and recording said pulses.

18. The method of claim 17 wherein said common selected offset frequency is synchronized with alternating power current.

19. The method of claim 18 wherein said set of first signals is frequency modulated onto a set of carrier frequencies before transmission, each carrier frequency differing from each other carrier frequency by at least a preselected bandwidth, said carrier frequencies being transmitted over power lines and said set of first signals are detected at said first location.

* * * * *